(12) United States Patent
Ohta

(10) Patent No.: US 6,328,768 B1
(45) Date of Patent: *Dec. 11, 2001

(54) SEMICONDUCTOR DEVICE MANUFACTURING LINE

(75) Inventor: Nahomi Ohta, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/958,157

(22) Filed: Oct. 27, 1997

(30) Foreign Application Priority Data

Oct. 28, 1996  (JP) .................................................... 8-284953

(51) Int. Cl.⁷ .......................... H01L 21/00; H01L 21/64; C23C 16/00
(52) U.S. Cl. .......................... 29/25.01; 118/719; 118/729
(58) Field of Search .......................... 29/25.01; 118/719, 118/729; 414/217, 221; 454/187; 438/800, 908

(56) References Cited

U.S. PATENT DOCUMENTS

| 5,100,276 | * | 3/1992 | Iwasaki et al. . |
| 5,256,204 | | 10/1993 | Wu . |
| 5,344,365 | | 9/1994 | Scott et al. . |
| 5,382,127 | * | 1/1995 | Garric et al. . |
| 5,536,128 | | 7/1996 | Shimoyashiro et al. . |
| 5,795,356 | * | 3/1992 | Leveen . |
| 6,099,598 | * | 8/2000 | Yokoyama et al. . |

FOREIGN PATENT DOCUMENTS

| 63-57158 | * | 3/1988 | (JP) . |
| 2-78243 | * | 3/1990 | (JP) . |
| 4-240714 | | 8/1992 | (JP) . |
| 5-90118 | | 4/1993 | (JP) . |
| 6-29368 | | 2/1994 | (JP) . |
| 6-84740 | | 3/1994 | (JP) . |
| 7-22488 | | 1/1995 | (JP) . |
| 7-66265 | | 3/1995 | (JP) . |

OTHER PUBLICATIONS

A Proposal from Tohoku University, "Break Through for Scientific Semiconductor Manufacturing in 2001," 05 No. 71, Special Issue on 2001 Semiconductor Manufacturing, 1992.*

Soji Fukuda et al., "Clean Room and Device Manufacturing System of the Future", *Ultra Clean Technology*, vol. 4, No. 516, 1992, pp. 240–250.

Kiyoosa Sadohara et al., "Reduction of Cost of Equipments by Local Clean Room", *Nikkei Microdevices*, Jun., 1995, pp. 136–141.

* cited by examiner

*Primary Examiner*—David E. Graybill
(74) *Attorney, Agent, or Firm*—Sughrue Mion, PLLC (57) ABSTRACT

In a semiconductor device manufacturing line, a wet process unit area is located at a substantial center of the manufacturing line and is provided with concentratedly arranged wet process units. A plurality of processing unit areas are located around the wet process unit area. A plurality of direct transfer mechanisms for transferring products are arranged between the wet process unit area and the respective processing unit areas, and an area transfer mechanism for transferring products is arranged among the processing unit areas.

10 Claims, 8 Drawing Sheets

SEMICONDUCTOR DEVICE MANUFACTURING LINE

BACKGROUND OF THE INVENTION

1. Field of the Invention

The present invention relates to a semiconductor device manufacturing line used in a plant for manufacturing semiconductor devices (wafers).

2. Description of the Related Art

Various floor layouts have been proposed for improving the manufacturing efficiency in semiconductor device manufacturing plants. The floor layouts of semiconductor device manufacturing plants are generally classified into two types; centralized type and distributed type.

In an example of a centralized semiconductor device manufacturing line, a rectangular plant floor is partitioned into processing areas, each having a surface area necessary for a specific process. Processing areas typically include a lithography process area, a dry etching process area, a chemical vapor deposition (CVD) process area, a heating process area, an ion implantation process area and a wet process area. Wafers are transferred between any two areas by means of an area transfer mechanism and reciprocating transfer mechanisms within a clean room (see JP-A-4-240714). In another example of a centralized semiconductor device manufacturing line, a plurality of processing areas are surrounded by an extremely clean atmosphere along with an operation area for conducting equipment control and maintenance operations, and a transfer/handling area for transferring and exchanging objects and works to be processed according to processing steps is provided. The operation area and the transfer/handling area are separated from and located close to the process areas (see JP-A-5-90118). An example of the centralized semiconductor device manufacturing lines will be explained later in detail.

In the above-mentioned prior art centralized semiconductor device manufacturing lines, although the number of wet process units is reduced, so that the investment cost can be reduced, when a wet process is carried out immediately before or after other processes, each wafer has to be moved over a long distance between the areas, so that the efficiency is remarkably reduced.

In an example of a distributed semiconductor device manufacturing line, a plurality of equipments for the same step and equipments of different steps are arranged in parallel, so that they may be combined with transfer equipment for continuous processing operations in order to improve the processing efficiency (see JP-A-2-78243). In another example of a distributed semiconductor device manufacturing line, modules of equipments are combined for a series of processing units, wherein the equipments of each module are arranged according to the processing sequence. A plurality of the same modules are provided, and a manufacturing line is established on the basis of modules (see JP-A-6-29368 and JP-A-6-84740). An example of the distributed semiconductor device manufacturing line will be explained later in detail.

In the above-described prior art distributed semiconductor device manufacturing line, although processing operations can be carried out continuously and a wet process can be carried out immediately before and after other processes, it inevitably involves the use of a large number of equipments for a wet process and other processes and hence an excessive cost of equipment investment.

Also, a radially-arranged semiconductor device manufacturing line has been suggested. That is, a control building including a back office is located at the center, and a plurality of independent buildings are arranged radially for respective processing step areas (see JP-A-4-240714). Further, multi-storied semiconductor device manufacturing lines have been suggested. That is, a semiconductor device manufacturing line is realized in the form of a multi-storied building, wherein a vertical transfer system is arranged at the center and processing step areas are arranged radially around the transfer system on each of the stories (Soji Fukuda et al., "Clean Room and Device Manufacturing System of the Future", Ultra Clean Technology, Vol. 4, No. 516, pp. 240–250, 1992, and Kiyoosa Sadohara et al., "Reduction of Cost of Equipments by Local Clean Room", Nikkei Microdevices, pp. 136–141, June, 1995).

In the above-mentioned prior art radially-arranged and multi-storied semiconductor device manufacturing lines, however, wafers have to be moved over a long distance between different process areas as in the case of the prior art centralized type lines so that the operational efficiency is deteriorated when a wet process is conducted immediately before and after other processes. Additionally, since wafers are inevitably crowded in and around the centrally located control building including a back office and the vertical transfer system, the operation of transferring wafers can be time consuming and that of controlling wafers can be complicated.

SUMMARY OF THE INVENTION

It is an object of the present invention to provide a semiconductor device manufacturing line which can minimize the number of wet units and the investment cost for equipment in wet process areas and reduce the distance and the time required for transferring wafers between the wet areas and some other process area, thereby improving the efficiency of conducting a wet process immediately before and after other processes.

According to the present invention, in a semiconductor device manufacturing line, a wet process unit area is located at a substantial center of the manufacturing line and is provided with concentratedly arranged wet process units. A plurality of processing unit areas are located around the wet process unit area. A plurality of direct transfer mechanisms for transferring products is arranged between the wet process unit area and the respective processing unit areas, and an area transfer mechanism for transferring products are arranged among the processing unit areas.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENTS

Before the description of the preferred embodiments, prior art semiconductor device manufacturing lines will be explained with reference to FIGS. 1 and 2.

Figure 1:
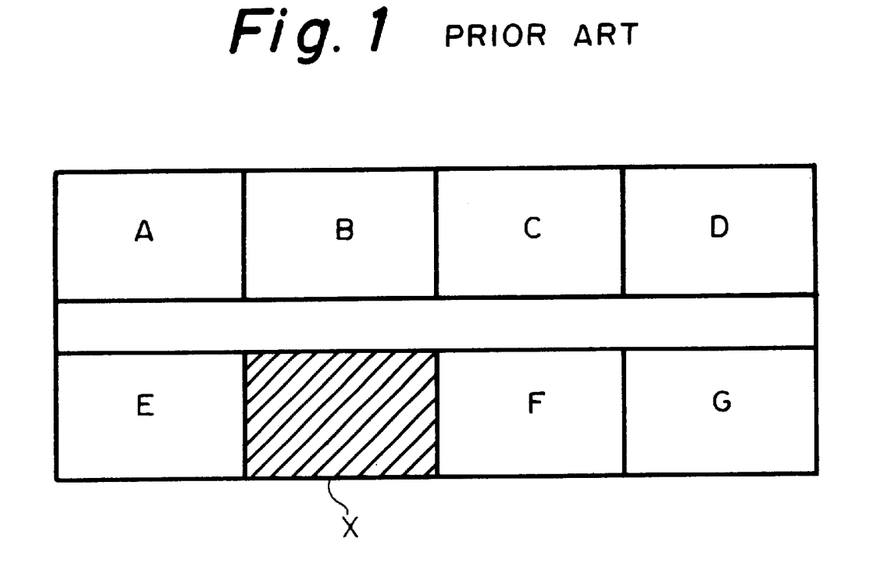
FIG. 1 is a layout diagram illustrating a prior art centralized type semiconductor device manufacturing line.

In FIG. 1, which illustrates a prior art centralized type semiconductor device manufacturing line, processing unit areas A, B, . . . , G each containing a set of equipments for a particular process are provided within a clean room. For example, the processing unit areas A, B, . . . , G are a lithography process unit area, a dry etching process unit area, a CVD process unit area, a heating process unit area, an ion implantation process unit area and the like. Only one wet process unit area X is located at a location of the manufacturing line. Wafers are transferred between any two areas by means of an area transfer mechanism and reciprocating transfer mechanisms. Thus, since the number of wet process units is reduced, the investment cost can be reduced.

In the manufacturing line of FIG. 1, however, when a wet process is carried out immediately before or after other processes, each wafer has to be moved over a long distance between the areas, so that the efficiency is remarkably reduced.

Figure 2:
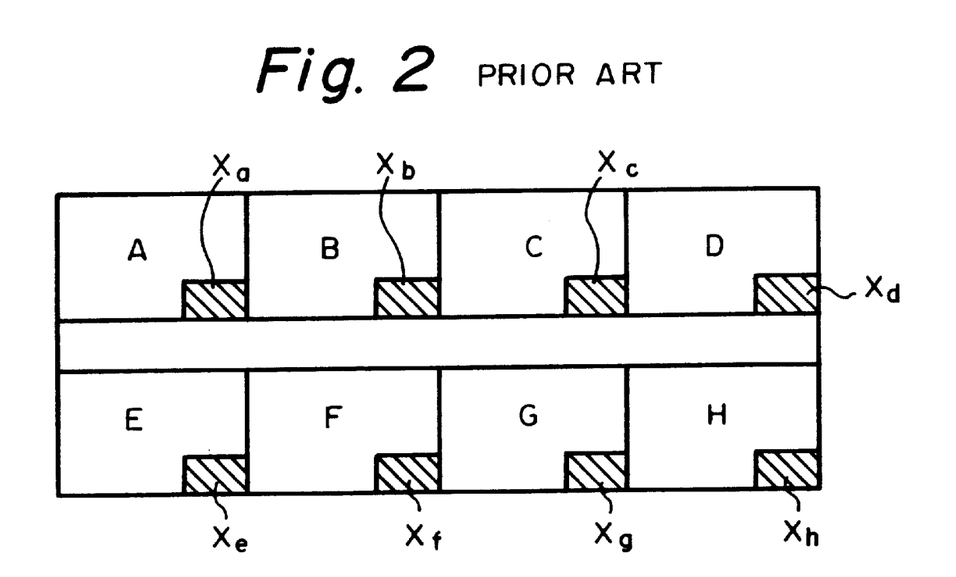
FIG. 2 is a layout diagram illustrating a prior art distributed type semiconductor device manufacturing line.

In FIG. 2, which illustrates a prior art distributed type semiconductor device manufacturing line, wet process unit areas $X_a$, $X_b$, . . . , $X_h$ are provided in processing unit areas A, B, . . . , H, respectively, within a clean room. As a result, processing operations can be carried out continuously and a wet process can be carried out immediately before and after other processes.

The manufacturing line of FIG. 2, however, inevitably involves the use of a large number of equipments for a wet process and other processes and hence an excessive cost of equipment investment.

Figure 3:
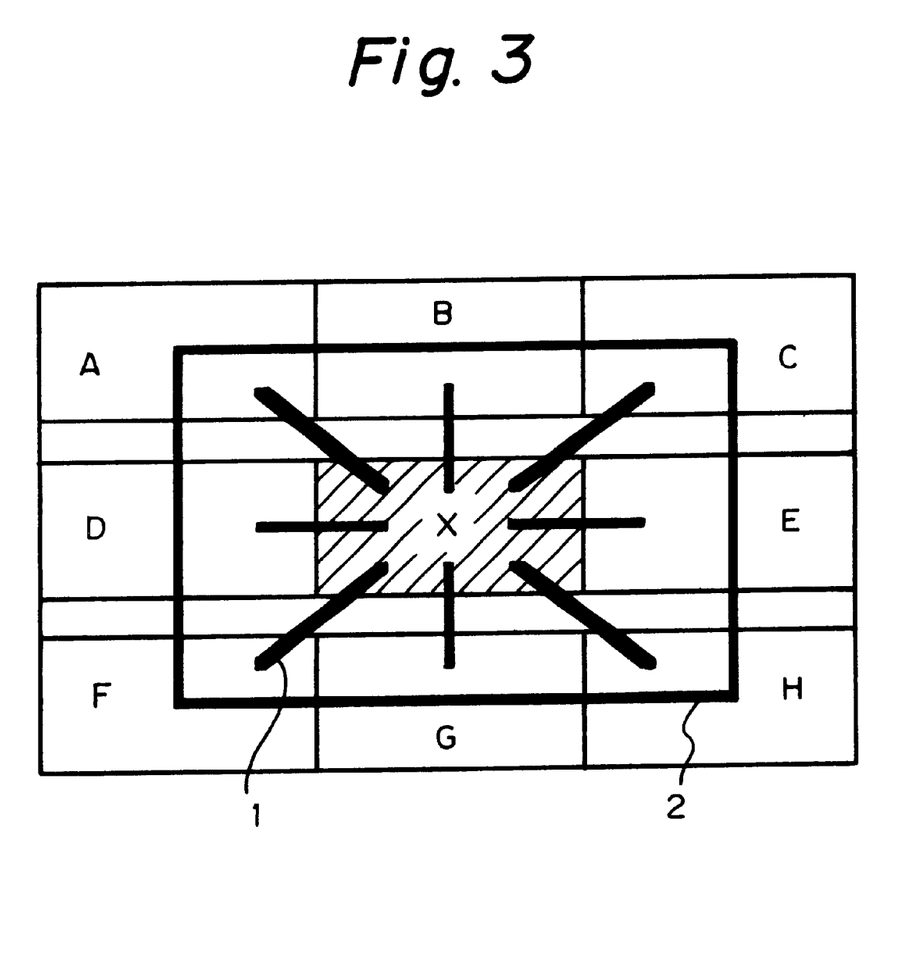
FIG. 3 is a layout diagram illustrating a first embodiment of the semiconductor device manufacturing line according to the present invention.

In FIG. 3, which illustrates a first embodiment of the present invention, processing unit areas A, B, . . . , H each containing a set of equipments for a particular process are provided within a clean room. Also, only one wet process unit area X is located at approximately the center of the manufacturing line. Also, direct transfer mechanisms 1 are arranged between the wet process unit area X and the respective processing unit areas A through H for transferring wafers, and an area transfer mechanism 2 connects the processing unit areas A through H for transferring wafers.

While wet units are concentratedly arranged within the wet process unit area X, part of them may be distributed among some of the processing unit areas A through H. The direct transfer mechanisms 1 and the area transfer mechanism 2 may be of a circulating type or a reciprocating type. Additionally, as the direct transfer mechanisms 1 and the area transfer mechanism 2, a carrier vehicle type transfer system, a tunnel type transfer system or a rail type transfer system can be used. Also, wafers may be contained in box-type carriers.

Figure 4:
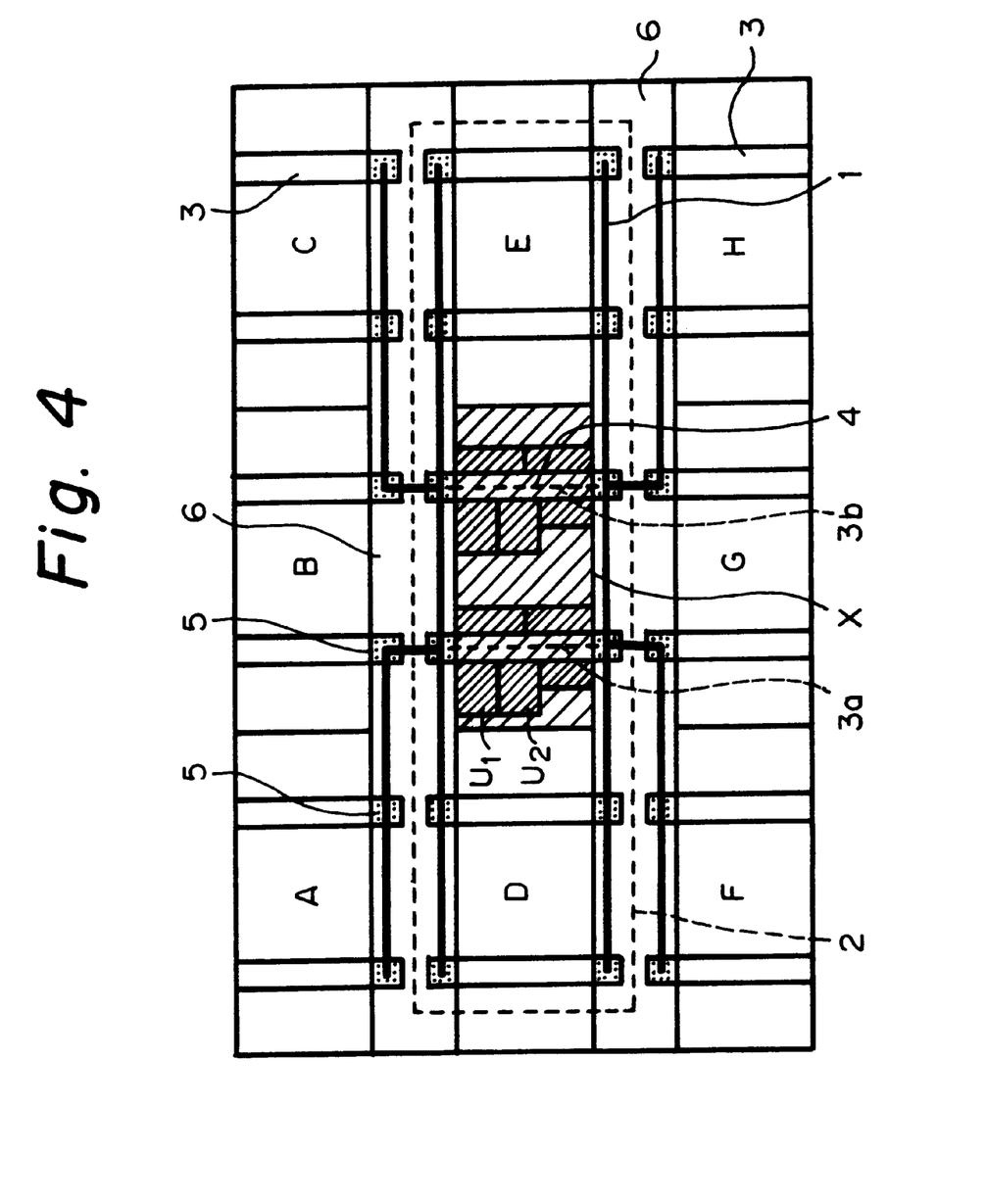
FIG. 4 is a first detailed layout diagram of the semiconductor device manufacturing line of FIG. 3.

In FIG. 4, which is a first detailed diagram of the semiconductor device manufacturing line of FIG. 3, the wet process unit area X is of a bay type where wet process units $U_1$, $U_2$, . . . are arranged along bays 3a and 3b within the wet process unit area X. Also, reciprocating transfer mechanisms 4 are provided in the bays 3a and 3b, thus moving wafers within the wet process unit area X.

Also, in FIG. 4, reference numerals 3 designate bays within the processing unit areas A, B, . . . , H, 5 designate transfer ports of the processing unit areas A, B, . . . , H and the wet process unit area X, and 6 designate a passage within the clean room.

In FIG. 4, the distance between the wet process unit area X and each of the processing unit areas A through H is minimized and the stand-by time required for each wafer before being transferred between any two processing unit areas is also reduced. More specifically, a wafer can be moved directly from the wet process unit area X to one of the processing unit areas A through H for a process in one of the processing unit areas A through H, for example, for a wet process after a dry etching process, by way of the corresponding direct transfer mechanism 1 connecting them without using the area transfer mechanism 2 to significantly reduce the stand-by time before the wafer is transferred, and also to reduce the actual transfer time. As a result, any undesired changes in the surface condition of wafers such as generation of corrosion can be minimized before a wet process to prevent deterioration of the effect of the wet process from taking place.

Additionally, a wafer can be moved directly from the wet process unit area X to one of the processing unit areas A through H for a process such as a CVD process, a sputtering process or a crystal growth process to be conducted in the processing unit area after a process such as a cleaning operation or a treatment using a hydrofluoric acid type solution conducted in the wet process unit area X directly by way of the corresponding direct transfer mechanism 1 without using the area transfer mechanism 2 within the clean room to significantly reduce the stand-by time before the wafer is transferred, and also to reduce the actual transfer time. As a result, any undesired changes in the surface condition of wafers such as contamination of the surface and/or growth of natural oxide film can be minimized after a wet process to prevent deterioration of the effect of the wet process from taking place.

Still additionally, since the wet process units $U_1$, $U_2$, . . . are concentratedly arranged within the wet process unit area X, a single system may be able to cover a number of processing steps. As a result, the number of equipments of the manufacture line of FIG. 4 can be minimized to reduce the size of the floor and hence the cost of equipment investment.

Figure 5:
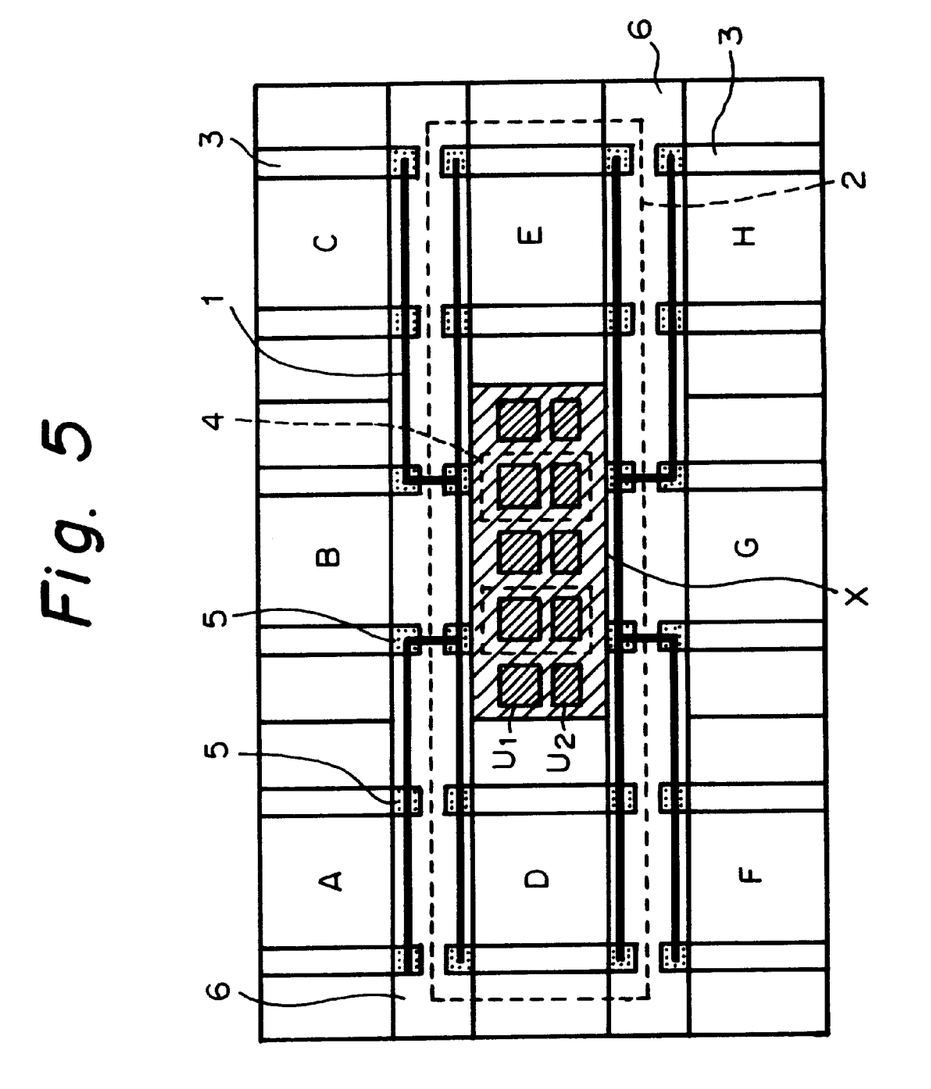
FIG. 5 is a second detailed layout diagram of the semiconductor device manufacturing line of FIG. 3.

In FIG. 5, which is a second detailed diagram of the semiconductor device manufacturing line of FIG. 3, the wet process unit area X is of a common room type where 35 the wet process units $U_1$, $U_2$, . . . are arranged within the wet process unit area X without the bays 3a and 3b of FIG. 4.

The effect by the semiconductor device manufacturing line of FIG. 4 can also be expected in the semiconductor device manufacturing line of FIG. 5.

Figure 6:
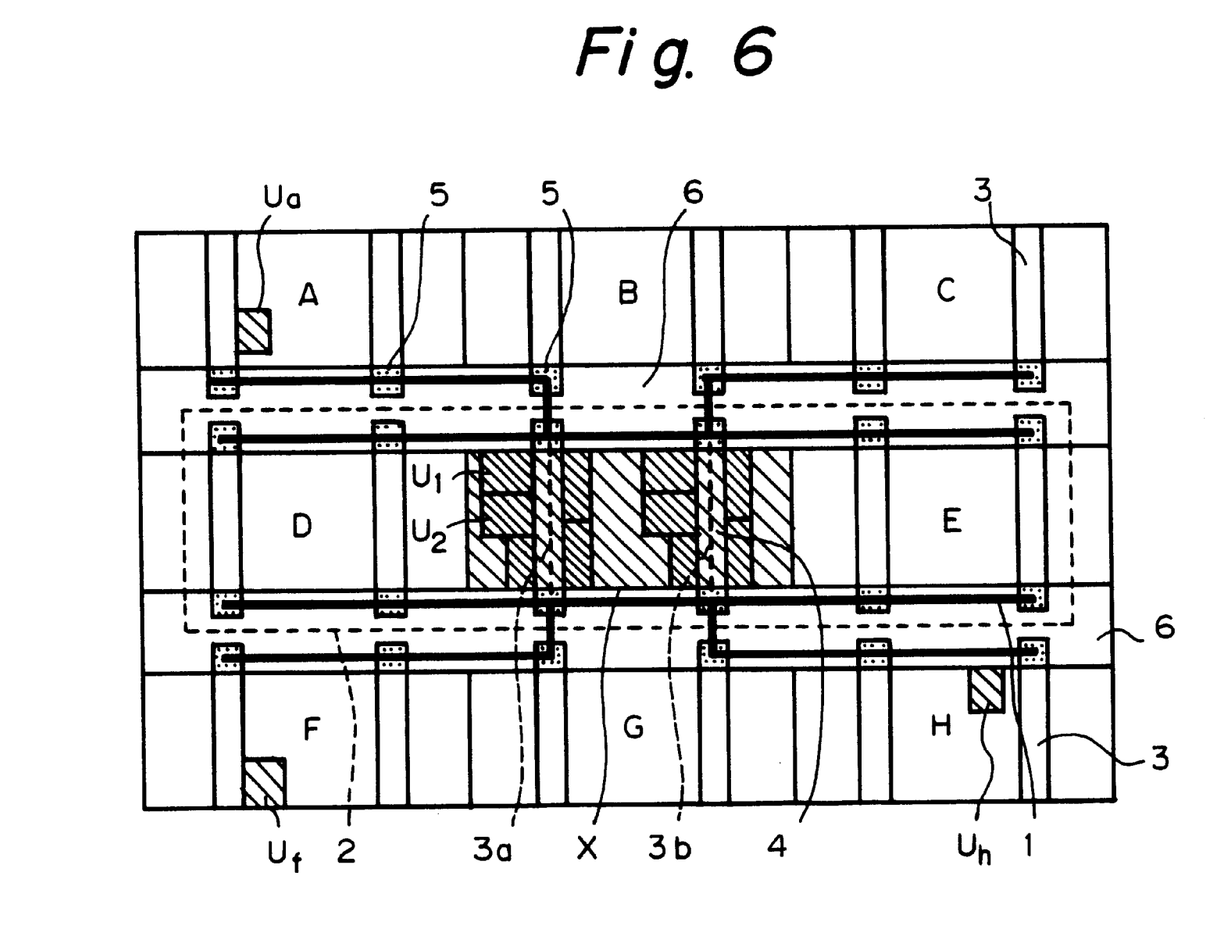
FIGS. 6 and 7 are layout diagrams of modifications of the semiconductor device manufacturing lines of FIGS. 4 and 5, respectively.
Figure 7:
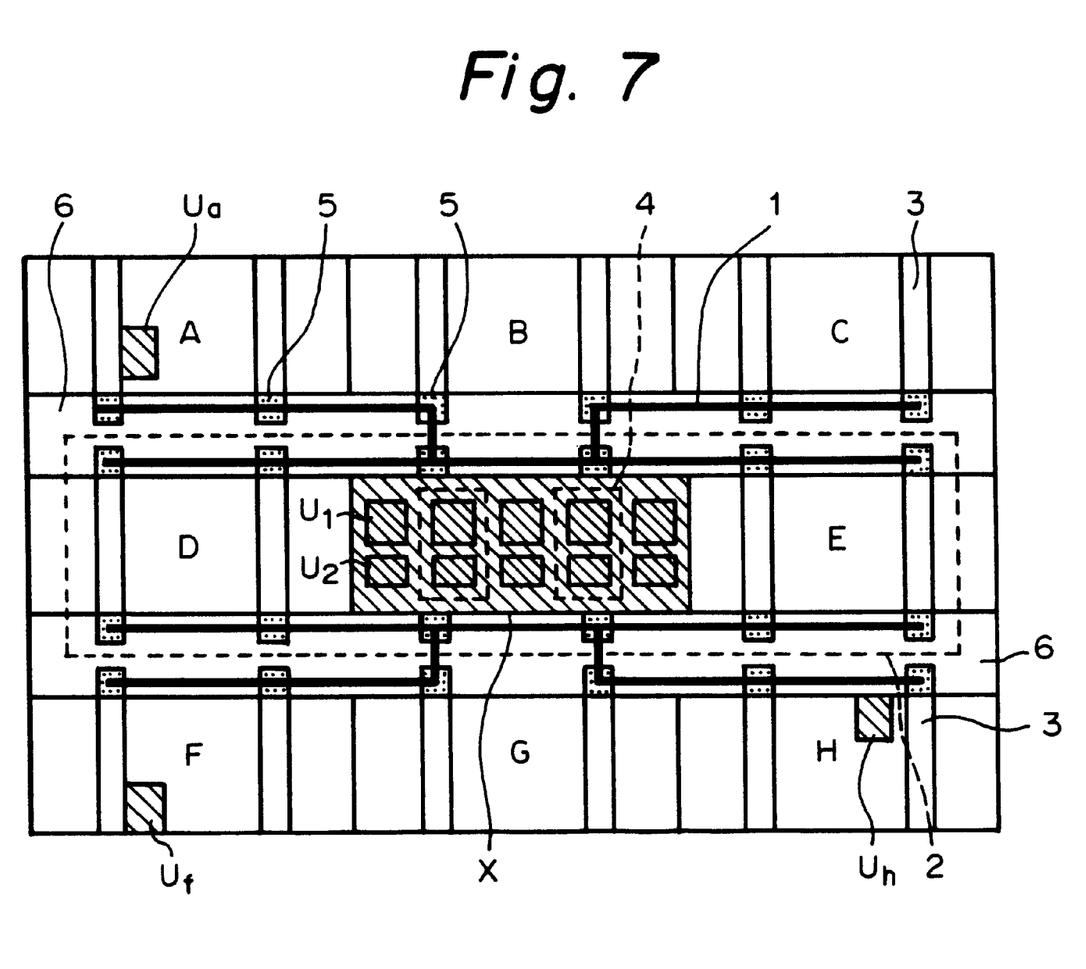

In FIGS. 6 and 7, which are modifications of the semiconductor device manufacturing lines of FIGS. 4 and 5, respectively, wet process units $U_a$, $U_f$ and $U_h$ are distributed among some of the processing unit areas A, F and H, respectively, where a process sensitive to changes in the surface condition of wafers such as a process of forming an oxide film on a substrate takes place.

While the semiconductor device manufacturing lines of FIGS. 6 and 7 may involve a higher cost of equipment investment than that of the semiconductor device manufacturing lines of FIGS. 4 and 5, because the wet process units $U_a$, $U_f$ and $U_h$ are distributed among some of the processing unit areas, this arrangement can greatly reduce the time required for transferring wafers immediately before and after a wet process and is particularly suited for a process that is particularly sensitive to changes in the surface condition of wafers.

Figure 8:
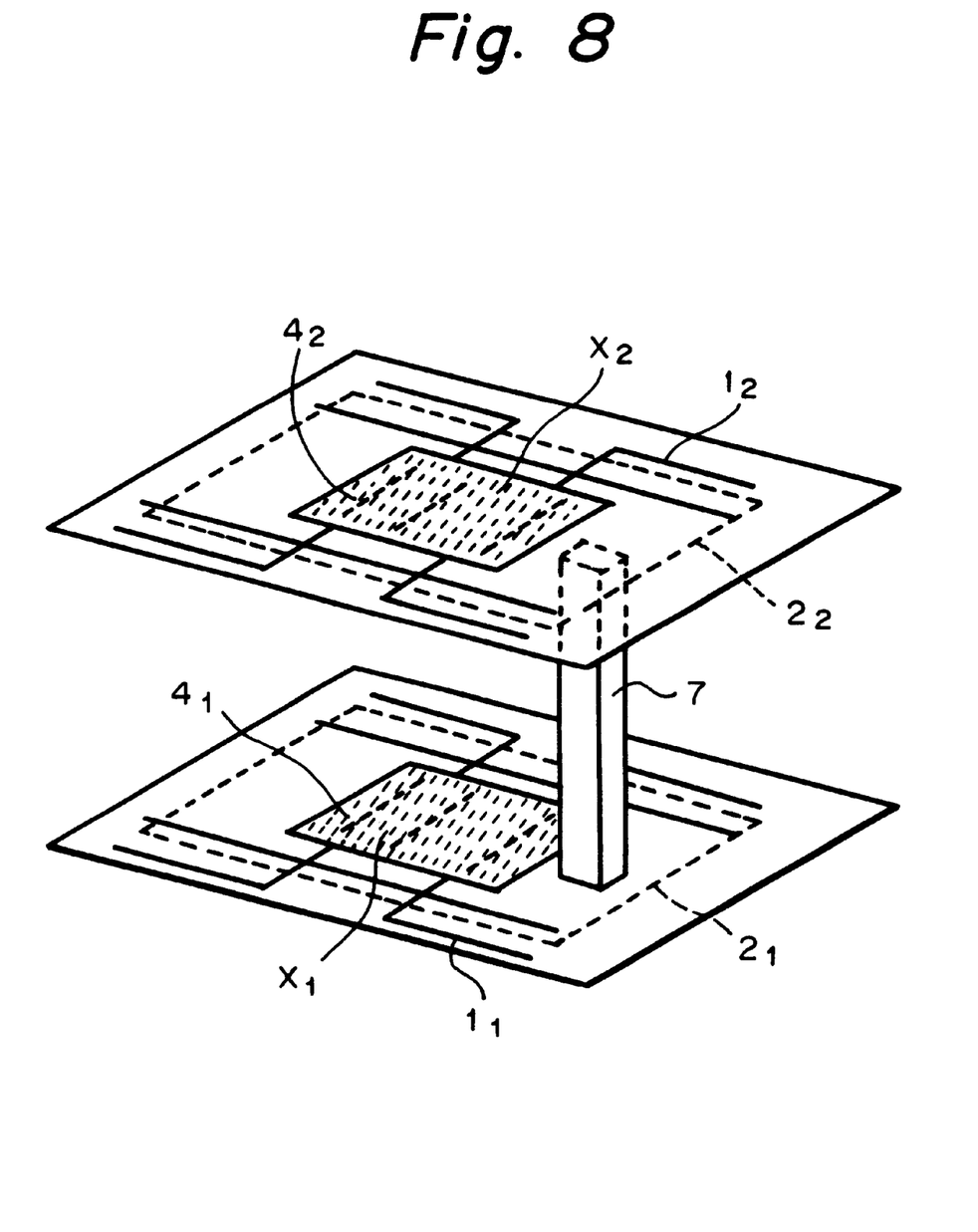
FIG. 8 is a layout diagram illustrating a second embodiment of the semiconductor device manufacturing line according to the present invention.

In FIG. 8, which illustrates a second embodiment of the present invention, a plurality of stories, for example, two stories each having the semiconductor device manufacturing line of FIG. 3 are provided. That is, a wet process unit area $X_1$ including reciprocating transfer mechanisms $4_1$, direct transfer mechanisms $1_1$ and an area transfer mechanism $2_1$ are provided on the first story, and a wet process unit area $X_2$ including reciprocating transfer mechanisms $4_2$, direct transfer mechanisms $1_2$ and an area transfer mechanism $2_2$ are provided on the second story. Additionally, a vertical transfer mechanism 7 is arranged through the stories for transferring wafers.

The manufacturing line of FIG. 8 can reduce the distance and the time. required for vertically moving wafers due to the vertical transfer mechanism 7.

Figure 9:
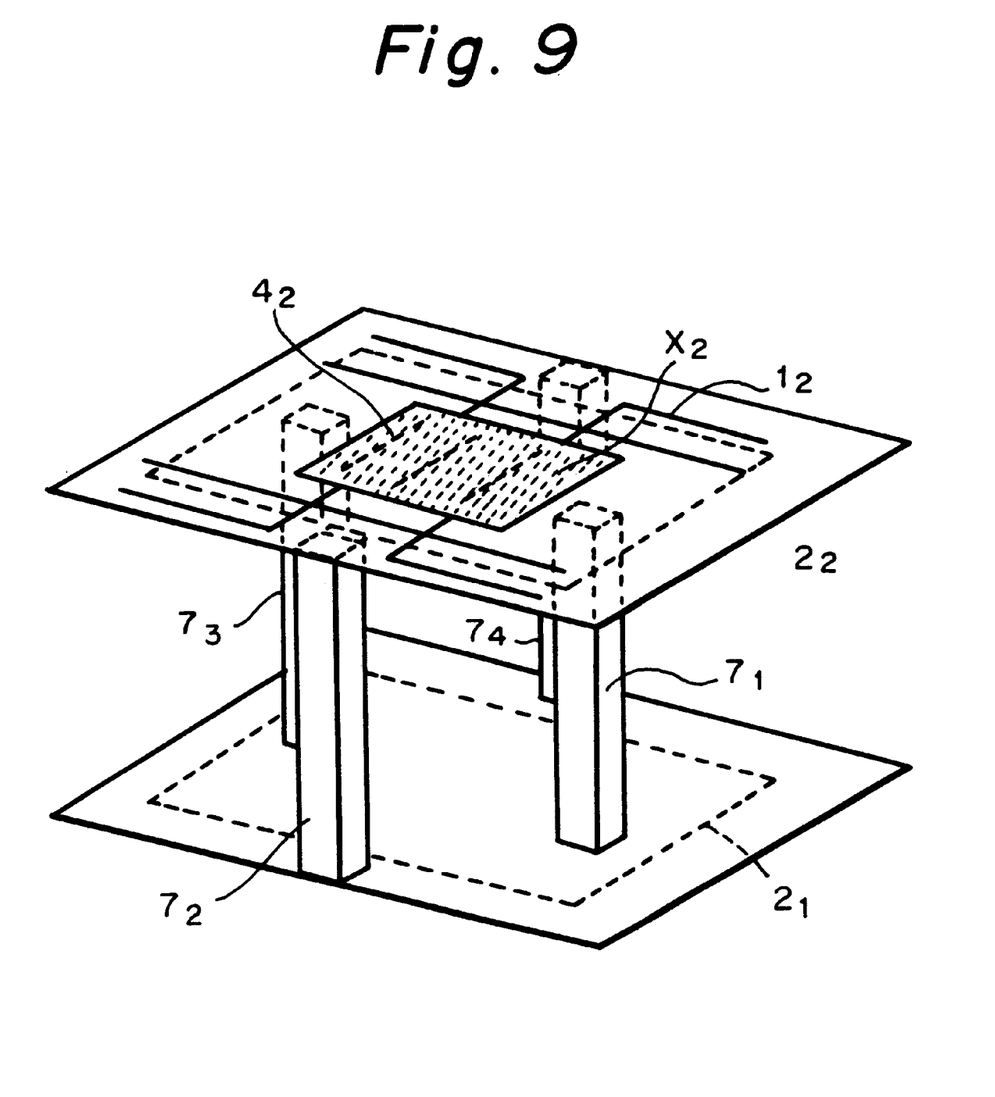
FIG. 9 is a layout diagram of a modification of the semiconductor device manufacturing line of FIG. 8.

In FIG. 9, which is a modification of the semiconductor device manufacturing line of FIG. 8, a wet process area concentratedly containing wet process units is arranged on a single story of a multi-storied semiconductor manufacturing line. That is, the wet process unit area $X_2$ of FIG. 8 is provided on the second story, but the wet process unit area $X_1$ of FIG. 8 is not provided on the first story. In this case, a plurality of vertical transfer mechanisms $7_1$, $7_2$, $7_3$ and $7_4$ are arranged through the stories for transferring wafers.

The manufacturing line of FIG. 9 can further reduce the distance and the time required for moving wafers if compared with the manufacturing line of FIG. 8 due to the plurality of vertical transfer mechanisms $7_1$, $7_2$, $7_3$ and $7_4$.

As explained hereinabove, according to the present invention, a limited number of wet process units can be shared by a plurality of wet processes, and the number of wet process units can be minimized to minimize the cost of equipment investment because one or more than one wet processing areas concentratedly containing wet process units are provided.

Additionally, since the wet process unit areas are arranged substantially at the center of the manufacturing line and direct transfer mechanisms are provided between the wet process unit area and the respective processing unit areas for transferring wafers, the distance and the time required for moving wafers between the wet process unit area and the respective processing unit areas can be reduced to improve the efficiency of conducting a wet process immediately before and after other processes. Thus, a semiconductor device manufacturing line according to the invention can maximally exploit the advantages of a wet process.

What is claimed is:

1. A semiconductor device manufacturing line for manufacturing a product, the manufacturing line comprising:

a wet process unit area located at a substantial center of said manufacturing line and provided with wet process units;

a plurality of processing unit areas located around said wet process unit area, said processing unit areas and said wet process unit area being arranged in a predetermined manner to process the product;

a plurality of first transfer mechanisms, arranged respectively between said wet process unit area and said processing units areas, wherein each of said processing unit areas is linked to said wet process unit area by at least one of said first transfer mechanisms without said at least one of said first transfer mechanisms linking any other one of said processing unit areas to said wet process unit area; and a second transfer mechanism, arranged among said processing unit areas.

2. The semiconductor device manufacturing line as set forth in claim 1, wherein said wet process unit area further comprises at least one bay, where said wet process units are arranged along said at least one bay provided in said wet process unit area.

3. The semiconductor device manufacturing line as set forth in claim 1, wherein said wet process unit area further comprises a common room, where said wet process units are arranged in said common room of said wet process unit area.

4. The semiconductor device manufacturing line as set forth in claim 1, wherein at least one of said processing unit areas includes a wet process unit.

5. A semiconductor device manufacturing line according to claim 1, wherein said wet process unit area further comprises a reciprocating mechanism, for transferring the product within said wet process unit area.

6. A semiconductor device manufacturing line according to claim 1, wherein said first transfer mechanism includes one of a circulating mechanism and a reciprocating mechanism.

7. A semiconductor device manufacturing line according to claim 1, wherein said second transfer mechanism includes one of a circulating mechanism and a reciprocating mechanism.

8. A semiconductor device manufacturing line according to claim 1, wherein said first transfer mechanism includes one of a carrier transfer system, a tunnel transfer system and a rail transfer system.

9. A semiconductor device manufacturing line according to claim 1, wherein said second transfer mechanism includes one of a carrier transfer system, a tunnel transfer system and a rail transfer system.

10. A semiconductor device manufacturing line according to claim 1, wherein said wet process units are concentrated in an adjacent manner in said wet process unit area.

* * * * *